United States Patent [19]

Ridder

[11] Patent Number: 4,561,112
[45] Date of Patent: Dec. 24, 1985

[54] BROADCAST RECEIVER WITH AUTOMATIC BROADCAST STATION STORAGE

[75] Inventor: Wouterus Ridder, Eindhoven, Netherlands

[73] Assignee: U.S. Philips Corporation, New York, N.Y.

[21] Appl. No.: 510,056

[22] Filed: Jul. 1, 1983

[30] Foreign Application Priority Data

May 4, 1983 [NL] Netherlands ............ 8301567

[51] Int. Cl.$^4$ ............... H03J 7/18; H04B 1/16
[52] U.S. Cl. .................... 455/166; 455/184; 455/186
[58] Field of Search ............ 455/161, 166, 184, 185, 455/186, 165, 183

[56] References Cited

U.S. PATENT DOCUMENTS 4,387,469  6/1983  Miyazaki et al. ............ 455/161
4,430,753  2/1984  Shiratani ............ 455/166

FOREIGN PATENT DOCUMENTS

3034155  3/1982  Fed. Rep. of Germany ...... 455/161
101418   6/1982  Japan ............ 455/186
95720    6/1982  Japan ............ 455/161

Primary Examiner—Jin F. Ng
Attorney, Agent, or Firm—Thomas A. Briody; William J. Streeter; Marianne Rich

[57] ABSTRACT

A broadcast receiver comprises a mixer to which an aerial signal and an oscillator signal are applied for generating an intermediate-frequency signal. The oscillator signal is produced by a generator and its frequency is determined by a tuning value which is applied to the generator. In addition, the receiver comprises a number of (N) preselection keys to each of which a predetermined fixed tuning value is assigned, so that by operating such a key that relevant tuning value is directly applied to the generator. Assigning a tuning value to a preselection key is effected by a micro-computer. This micro-computer produces a fixed sequence of auxiliary tuning values which are sequentially applied to the generator. The intermediate-frequency signal obtained in response to each auxiliary tuning value is converted into a test value in a conversion circuit. These test values are compared to reference values from a fixed sequence of decreasing reference values. Only tuning values associated with test values exceeding the reference value are stored. Thus only those tuning values are assigned to the preselection keys which correspond to the broadcast transmitters which are receivable best in the overall wave range at that location.

3 Claims, 19 Drawing Figures

BROADCAST RECEIVER WITH AUTOMATIC BROADCAST STATION STORAGE

BACKGROUND OF THE INVENTION (1) Field of the invention

The invention relates to a receiver, more specifically to a radio or TV receiver arranged for receiving broadcast signals. These signals are transmitted by broadcast transmitters and are formed by a carrier signal having a predetermined nominal frequency, on which carrier signal an information signal (AM or FM) is modulated. This information signal is alternatively denoted the "programme". This receiver further comprises one or more preselection keys by means of which the receiver is directly tuneable to a broadcast transmitter assigned to such a key, for receiving the programme transmitted by this transmitter. Assigning a broadcast transmitter to a preselection key, that is to say "programming" the preselection keys, is automated and effected by a control circuit in the form of a micro-computer, on receipt of a preprogramming actionstart-command.

(2) Description of the prior art

As is generally known, broadcast receivers comprise a mixing circuit to which on the one hand an aerial signal supplied by an aerial is applied and on the other hand an oscillator signal. This mixing circuit produces an output signal denoted the intermediate frequency signal. The oscillator signal is generated by a generator of a type in which the frequency of the oscillator signal is determined by a so-called tuning value. This tuning value thus characterizes a specific broadcast transmitter and is a number (usually in binary representation) which is characteristic of the value of a quantity which can be varied in the generator. The actual type of quantity depends on the construction of the generator.

With a present very current embodiment this generator comprises a resonant circuit having a capacitor in the form of a varicap diode. The tuning frequency of this resonant circuit is determined by the capacitance of this capacitor, which capacity itself is determined by a setting voltage applied to the varicap diode. This setting voltage is produced by a digital-to-analog converter and is proportional to the tuning value.

In another, very current embodiment the generator comprises a synthesizer circuit which, as is known, is provided by a phase-locked loop (PLL) and an adjustable frequency divider included in this loop. The frequency of the oscillator signal produced by this synthesizer circuit now depends on the dividing factor of the frequency divider and this dividing factor is proportional to the tuning value.

In order to increase ease of operation, contemporary receivers are often provided with a preselection memory having a plurality, for example N, addressable memory locations (see for example, German Offenlegungsschrift No. 28 50 733). In each memory location the tuning value of a receivable broadcast transmitter is stored. In addition, a control field is provided having a plurality of preselection keys. One of the memory location is unambiguously associated with each key, or with combinations of keys. This means that if a given key or a given combination of keys is operated, the tuning value from a given memory location is applied to the generator.

Preprogramming the preselection memory, that is to say storing tuning values in memory locations, must then indeed be effected manually and separately for each memory location and consequently for each receivable broadcast transmitter. For receivers which are normally speaking not meant to be moved this is usually no problem. For mobile receivers, such as car-radios this will often result in unsurmountable problems, as these receivers will namely be often moved to areas where not all the preprogrammed broadcast transmitters, or even none of them, are receivable, while moreover the associated tuning values of the broadcast receivers which can be received in that area are not known. In practice it has been found that the increase in the ease of operation which is the object of preprogramming the preselection memory can often not be realized. It has therefore already been proposed to have the preprogramming of the preselection memory be effected automatically. A known receiver of this type comprises for that purpose start-command generation means in the form of what is commonly referred to as an ASPM-key (ASPM=Automatic Station Programme Memory) provided on the control field and which, when operated, produces a preprogramming action-start-command. In addition, this known receiver comprises a control circuit in the form of a micro-computer, which starts a preprogramming action in response to the preprogramming action-start-command. To that end it starts generating a fixed sequence of auxiliary tuning values which are sequentially applied to the generator. By means of a detector circuit coupled to the output of the mixing circuit it is determined whether a generated auxiliary tuning value corresponds to a receivable broadcast transmitter. If so, then this auxiliary tuning value is stored in a memory location assigned for that purpose in the preselection memory. Independent of the fact whether the generated auxiliary tuning value corresponds or does not correspond to a receivable broadcast transmitter a further auxiliary tuning value is thereafter generated from the fixed sequence. If all the memory locations have been filled in this way, or when the last auxiliary tuning value of the fixed sequence has been generated, the generation of further auxiliary tuning values is stopped.

It should be noted that the fixed sequence of tuning values has been chosen such that it accurately covers a whole wave-range, for example the overall FM-band.

OBJECT AND SUMMARY OF THE INVENTION

The invention has for its object to provide an improvement in the above-described receiver which is arranged for automatically preprogramming the memory locations of the preselection memory.

According to the invention
the output of the mixing circuit is therefore coupled to
  a conversion circuit for converting the mixing circuit output signal obtained in response to a tuning value into
a test value associated with this tuning value, the control circuit is further arranged for:
  generating a sequence of reference test values of decreasing significance;
  comparing the test values, produced in response to the sequence of auxiliary tuning values by the conversion circuit with reference test values;
  storing those N auxiliary tuning values, as preselection tuning values, in the different memory locations of the preselection memory, the associated test values of which have the highest possible significance.

The advantage of the receiver according to the invention relative to the known receiver operating with an automatic preprogramming action will become obvious when the fact is considered that in this known receiver it is each time checked whether an auxiliary tuning value corresponds to a receivable broadcast receiver. This means that as soon as N receivable broadcast transmitters have been detected all the memory locations of the preselection memory are filled with a tuning value. The disadvantage of this known receiver now is that generally these tuning values will not correspond to those N broadcast transmitters from the selected wave range which can locally be received best. In the extreme case this may happen to be just all those broadcast receivers which are barely receivable. This disadvantage of the known receiver is wholly eliminated by the measures according to the invention.

DESCRIPTION OF EMBODIMENTS

Receiver structure

Figure 1:
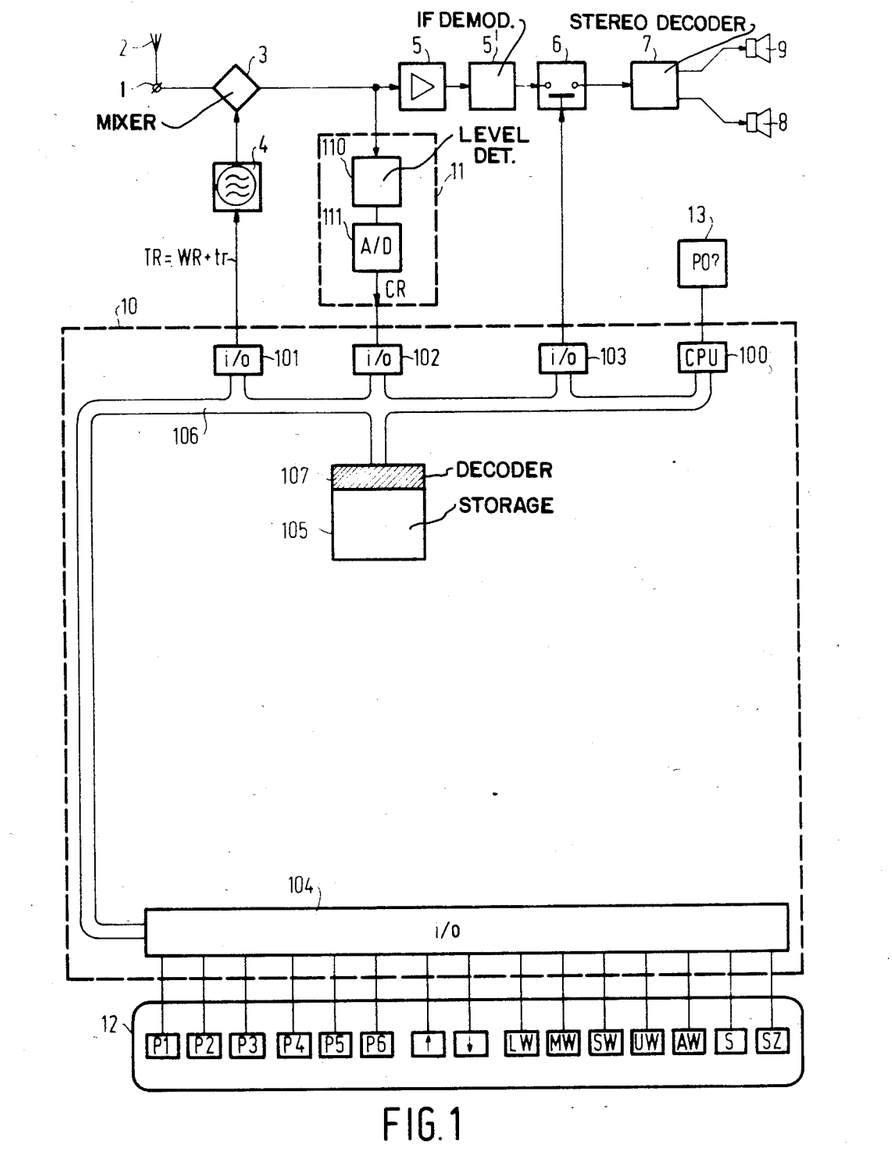
FIG. 1 shows the general structure of a receiver according to the invention, more specifically a radio receiver.

FIG. 1 shows the general structure of a receiver according to the invention, more specifically a radio receiver. It has an input 1 for receiving an aerial signal supplied by an aerial 2. This aerial signal is formed by a very large number of frequency-stacked broadcasting signals transmitted by broadcast transmitters and are each formed by a carrier signal having a predetermined nominal frequency and an information signal AM or FM-modulated thereon. This aerial signal is applied to a mixing circuit together with an oscillator signal produced by a generator 4. This mixing circuit 3 produces an output signal which is denoted the intermediate frequency signal. It is applied via an intermediate frequency amplifier 5, an intermediate frequency demodulator 5' and a switch 6 which is shown symbolically only, to a stereo decoding circuit 7, which produces the left signal and the right signal of a stereophonic signal. These signals are applied to the respective loudspeakers 8 and 9.

Let it be assumed that generator 4 is in the form of a synthesizer which, as is known, comprises an adjustable frequency divider. This synthesizer produces an oscillator signal, the frequency of which is determined by the divisor of this adjustable frequency divider. This divisor is equal to or derived from a transmitter value TR applied to this generator 4 and produced by a control circuit 10. Hereinafter it will be assumed that this transmitter value is equal to the sum of a wave range value WR (=wave range), which is characteristic of the selected wave range and a tuning value tr, which is characteristic of a transmitter within the selected wave range. Let it be assumed that for the tuning value tr in the selected wave range it holds that $0 \leq tr \leq tr(.,MX)$. Herein $tr(.,MX)$ represents the selected wave range-dependent maximum tuning value.

Switch 6, which is arranged between the intermediate frequency demodulator 5' and the stereo decoding circuit 7 is controlled by a so-called muting signal, which is also produced by the control circuit 10. The signal path to the stereo decoding circuit 7 can be interrupted by means of this switch.

The intermediate frequency signal is not only applied to the amplifier 5 but also to a converter circuit 11, which produces a test value associated with the transmitter value tr and consequently with the tuning value TR applied to the generator 4. This test value can be composed such that it furnishes information about a number of important characteristic quantities of the broadcast receiver received, for example about its field strength, the degree in which it evidences multi-path distortion, whether it provides traffic information etc. Hereinafter it will be assumed for the sake of simplicity that this test value indicates the value of the field strength with which the broadcast receiver is received. This test value will be designated the receiving level of the transmitter in the further course of the description and will be denoted by CR. To determine this receiving level, this conversion circuit 11 is provided in the embodiment shown with a level detector 110 which is constructed in known manner and produces by way of output signal a level signal the magnitude of which is proportional to the amplitude of the intermediate frequency signal and consequently to the field strength of the broadcast receiver received. This level signal is applied to an analog-to-digital converter 111. Therein it is subjected to, for example, a 16-level linear quantization and a 4-bit code word is generated which represents this receiving level.

This receiver further comprises a detection circuit 13, which gives at its output an indication whether the receiver is in the switched-on or in the switched-off state. If the receiver is on, then this detection circuit produces, for example, a logic "1", if it is in the off-condition the detection circuit produces a logic "0".

In addition, an operating panel 12 is connected to the control circuit 10. This control panel comprises inter alia six preselection keys indicated in the Figure by P1, P2, . . . P6, respectively; two manually operated tuning keys, the tuning-up key which is denoted by the symbol ↑ and the tuning-down key denoted by the symbol ↓; a wave range key LW for long-wave transmitter, a wave range key MW for medium-wave transmitters, a wave range key SW for short-wave transmitter, a wave range key UW for FM transmitters, a wave range key AW, the meaning of which will be further explained hereinafter; a storage key S and a step-size key SZ, whose meaning will also be further explained hereinafter.

As has already been described above, the operation of the receiver is supervised by the control circuit 10, which is in the form of a micro-computer. It comprises inter alia a central control unit (CPU 100) four i/o-gates 101, 102, 103, 104 and also a storage medium 105. All these elements are intercoupled in known manner by means of a bus system 106. It should be noted that the storage medium 105 is connected to this bus system via a decoding circuit 107.

Figure 2:
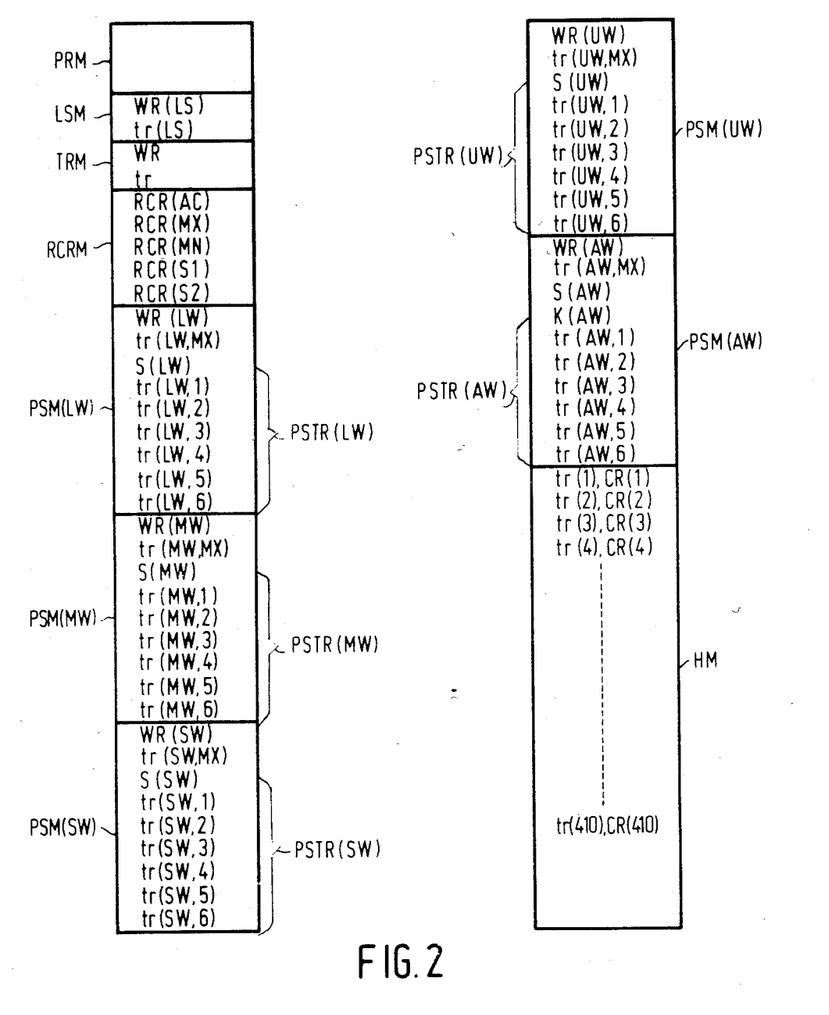
FIG. 2 shows in greater detail the content of a portion of the memory used in the receiver shown in FIG. 1.

As is shown schematically in FIG. 2, the storage medium 105 is subdivided into a plurality of memories, each comprising a plurality of addressable memory locations. More specifically, this storage medium comprises:

a programme memory PRM in which all the required programme steps have been stored.

A last-station memory LSM in which the wave range value WR(LS) and the tuning value tr(LS) of the transmitter the receiver was tuned to at the moment it was switched off have been stored.

A transmitter memory TRM in which there are stored the wave range value WR and the tuning value tr of the transmitter to which the receiver is tuned; that is the actual transmitter value TR.

A reference level memory RCRM in which there are stored the actual reference level RCR(AC), the maximum reference level RCR(MX), the minimum reference level RCR(MN), a first reference step size RCR(S1) and a second reference step size RCR(S2). These step sizes denote values by which the actual reference level can be changed. Whether this change is effected with the step size RCR(S1) or with the step size RCR(S2) depends on the fact whether the step-size key SZ is operated or not operated, respectively. In a well-tried embodiment of the receiver these reference step sizes have been chosen such that RCR(S1)=2RCR(S2), and in addition RCR(MX)=15, RCR(MN)=0 and RCR(S2)=1.

Five preselection memories (PSM(LW), PSM(MW), PSM(SW), PSM(UW), PSM(AW), which contain the most important data for the transmitters in the long wave range, the medium wave range, the short wave range, the ultra-short wave range and the wave range AW, respectively. These memories each contain, for example the following quantities:

a wave range value WR(.) which is a measure of the lowest frequency which can occur in the relevant wave range;

a maximum tuning value tr(.,MX) which may occur in that wave range (the minimum tuning value is equal to zero);

a tuning step size S(.) with which the actual tuning value tr present in the transmitter memory TRM can be changed. For the long wave range, the medium wave range and the short wave range this step size is chosen such that it corresponds to a 1 kHz frequency step in the oscillator signal. For the ultra-short wave range the step size S(UW) is chosen such that it corresponds to a frequency step of 25 kHz in the oscillator signal;

a preselection transmitter memory PSTR(.) in which for N=6 preferred transmitters the associated preselection tuning values tr(.,i) are stored; i=1, 2, 3, 4, 5, 6.

The preselection memory field PSM(AW) further comprises a quantity K(AW) indicating the number of transmitters in the wave range AW and giving more particularly the ratio between the maximum tuning value tr(AW,MX) and the tuning step size S(AW).

An auxiliary memory HM in which, for example, at least 410 auxiliary tuning values tr(m) with the associated receiving levels CR(m) can be stored.

It should be noted that the long wave range extends from 145 kHz to 289 kHz, the medium wave range from 522 kHz to 1611 kHz, the short wave range from, for example, approximately 6 MHz to approximately 10 MHz and the ultra-short wave range from 87.5 MHz to 108 MHz.

It should also be noted that although in the foregoing the wave range AW is considered as an independent wave range, it must correspond to one of the other wave ranges. If it corresponds to one of the wave ranges LW, MW or SW then WR(AW) is equal to WR(LW), WR(MW) or WR(SW) and tr(AW,MX) is equal to tr(LW,MX), tr(MW,MX) or tr(SW,MX), while the tuning step size S(AW) is chosen such that it corresponds to a frequency step of, for example, 9 kHz in the oscillator signal. In practice, this wave range AW will usually correspond to the ultrashort wave range UW, so that WR(AW)=WR(UW), tr(AW,MX)=tr(UW,MX) and S(AW) corresponds to a frequency step of, for example, 50 kHz in the oscillator signal. This means that k(AW)=410. The six preselection tuning values tr(AW,i) then represent FM-transmitters.

Receiver operation

The mode of operation of the receiver is wholly controlled by the micro-computer 10, whose operating mode can be divided into a large number of control operations and control actions which are each stored in the form of a programme in the programme memory PRM; the most important operations and actions will be explained in greater detail hereinafter.

Figure 3:
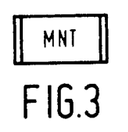
FIGS. 3 to 19, inclusive are diagrams to explain the operation of the receiver shown in FIG. 1.

In a monitoring operation it is determined whether a control key has been operated. If so, a so-called interrupt signal is given. Thereafter it is determined which control key has been operated and if this was possibly effected during a predetermined period of time. This operation is symbolically shown in FIG. 3.

Figure 4:
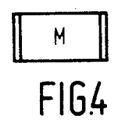

In a mute operation a logic "1" is applied via the i/o-gate 103 to switch 6, which in response thereto interrupts the signal flow from amplifier 5 to stereo decoding circuit 7, so that no programme is audible any longer. This operation is symbolically shown in FIG. 4.

Figure 5:
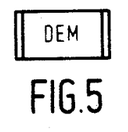

In a demute operation a logic "0" is applied via i/o-gate 103 to switch 6, which in response thereto re-establishes the signal flow from amplifier 5 to stereo decoding circuit 7. This operation is symbolically shown in FIG. 5.

Figure 6:
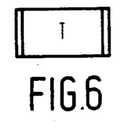

In a tune operation the wave range value WR and the tuning value tr of the transmitter memory TRM are added together and their sum is applied to the generator 4 as a transmitter value TR via i/o-gate 101. This wave range value WR and this tuning value tr are also stored in the memory LSM. This operation is symbolically shown in FIG. 6.

Figure 7:
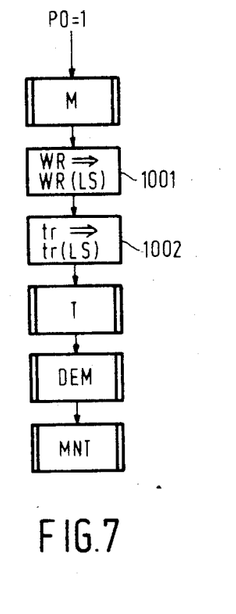
Figure 8:
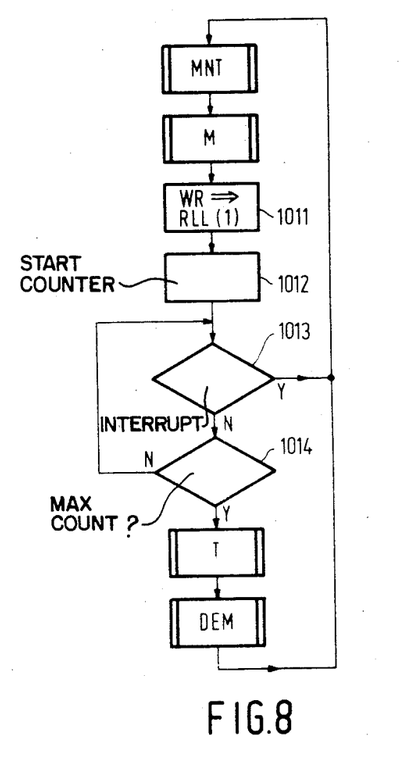

When the receiver is switched on, detector 13 produces a logic "1" in response to which the switch-on action shown in FIG. 7 is effected. This action includes the mute operation followed by a step 1001 in which the actual wave range value WR in the transmitter memory TRM is made equal to the wave range value WR(LS) stored in the last-station memory LSM. In a similar way, in step 1002 the actual tuning value tr in the transmitter memory TRM is made equal to the tuning value tr(LS) stored in the memory LMS. Thereafter the tuning operation and the demute operation are effected in succession followed by the monitor operation. The tuner is now tuned to the same transmitter as the transmitter it was tuned to at the moment it was switched off.

In order to tune the switched-on receiver to a transmitter in a given wave range, the wave range key associated with that wave range must first be operated. This gives access to the data stored in the preselection memory PSM(.) associated with this wave range key. If the microcomputer effects the monitor operation at the moment the wave range key is operated, the wave range adjusting action shown in FIG. 1 also proceeds. This wave range adjusting action includes the mute operation followed by a step 1011 in which the wave range value WR in the transmitter memory TRM is made equal to the wave range value WR(.) of the relevant wave range. After step 1011 has been effected, a counter comprised in the CPU is started in step 1012. If after starting this counter it is ascertained in step 1003 that an interrupt signal has occurred because another control key has been operated, then the monitor operation is effected again. If, however, no interrupt signal is given and it is ascertained in step 1014 that the counter has reached a predetermined maximum counting position, then the tune operation and the demute operation are effected in succession and the micro-computer is readjusted to the monitor operation.

Figures 9, 10, 11:
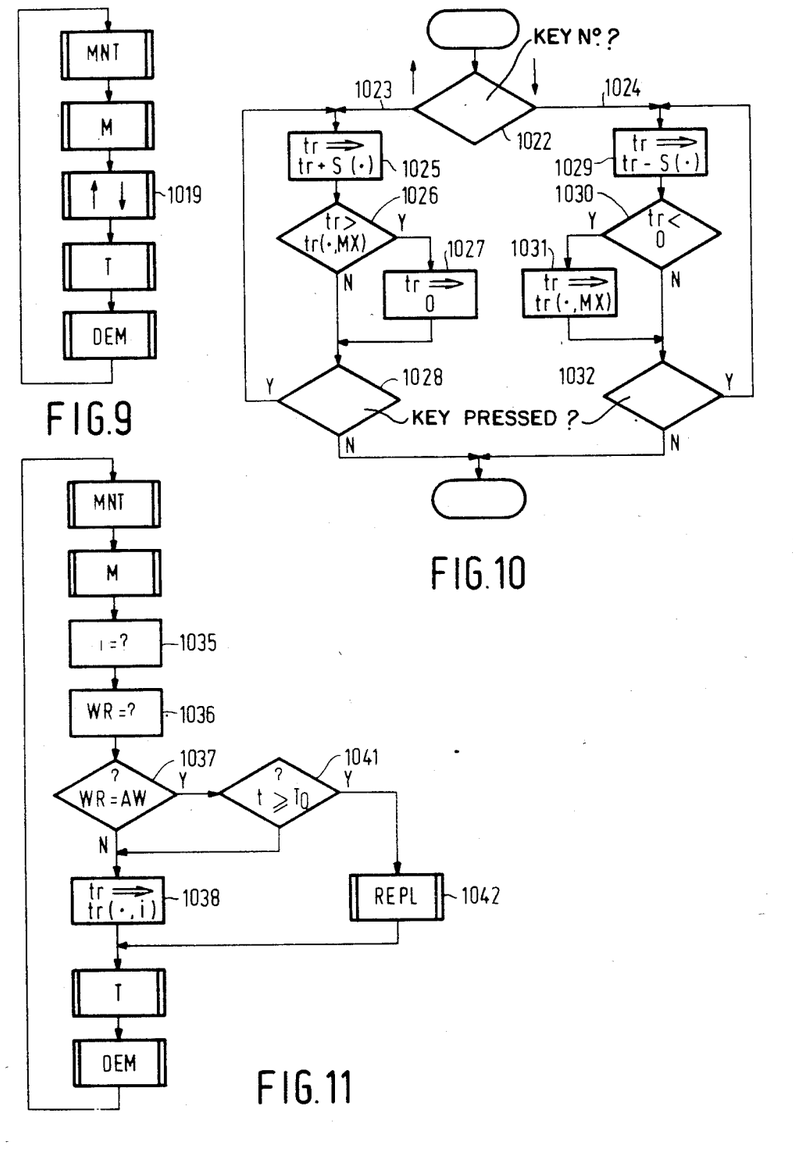

If now during the monitoring operation it is ascertained that one of the two manual tuning keys has been operated then the manual tuning action shown in FIG. 9 is effected. Therein the mute operation is followed by a manual tuning operation 1019 by means of which the actual tuning value tr stored in the transmitter memory TRM is changed in steps of the size S(.). After a given, new tuning value tr has been stored in the transmitter memory TRM by means of this manual tuning operation, the tuning operation and the demute operation are effected in succession, thereafter the micro-computer returns to the monitor operation.

The manual tuning operation denoted in FIG. 9 by reference numeral 1019 is shown in detail in FIG. 10. It contains a step 1022 in which it is determined which one of the two manual tuning keys has been operated. If the tuning-up key has been operated then the tuning-up cycle 1023 commences to. If in contrast therewith the tuning-down key has been operated then the tuning-down cycle 1024 starts to.

The tuning-up cycle 1023 comprises a step 1025 in which the actual tuning value tr stored in the transmitter memory TRM is incremented by the step size S(.) to tr+S(.). The new tuning value is compared in step 1026 with the maximum tuning value tr(.,MX) of the adjusted wave range. If the new tuning value exceeds this maximum tuning value then this new tuning value is assumed to be equal to zero in step 1027. Finally, in step 1028 it is checked whether the tuning-up key is still being operated. If so, then the tuning-up cycle 1023 starts again.

The tuning-down cycle 1024 comprises a step 1029 in which the actual tuning value tr stored in the transmitter memory TRM is decremented with the step size S(.) to tr—S(.). This new tuning value is compared with the value zero in step 1030.

If the new tuning value is less than zero, then the new tuning value is replaced in step 1031 by the maximum tuning value tr(.,MX) of the relevant wave range. Finally, in step 1032 it is checked whether the tuning-down key is still being operated. If so, then the tuning-down cycle 1024 starts again.

As has already been mentioned above, each preselection memory PSM(.) comprises a preselection transmitter memory PSTR(.) in which for the relevant wave range a number (in the embodiment shown six) of preselection tuning values tr(.,i) of six preset stations are stored. To tune the receiver to such a preset transmitter a preselection key Pi must be operated. In response thereto the preselection action shown in FIG. 11 is performed by the micro-computer. In this action, the mute operation is first followed by a step 1035 in which the number i of the operated preselection key Pi is determined. Thereafter, in step 1036, it is checked which wave range key LW, MW, SW, UW, or AW was operated last and in step 1037 it is checked whether that might have been the wave range key AW. If the wave range key which was operated last was not key AW but, for example, MW then in step 1038 the tuning value tr of the transmitter memory TRM is replaced by the preselection tuning value tr(MW,i). Thereafter the tune operation and the demute operation are effected, whereafter the micro-computer returns again to the monitor operation. If the wave range key which was operated last was indeed the wave range key AW, then in step 1041 it is checked whether the preselection key Pi was operated uninterruptedly for longer than a predetermined period of time $T_o$ (for example longer than five seconds). If not, then in step 1038 the tuning value tr from the transmitter memory CRM is replaced by the preselection tuning value tr(AW,i). If key Pi was indeed operated longer than that predetermined peiod of time, then a replace operation 1042 (REPL=replace) is effected which will be described in further detail hereinafter, and thereafter the tune operation is effected.

Figure 12:
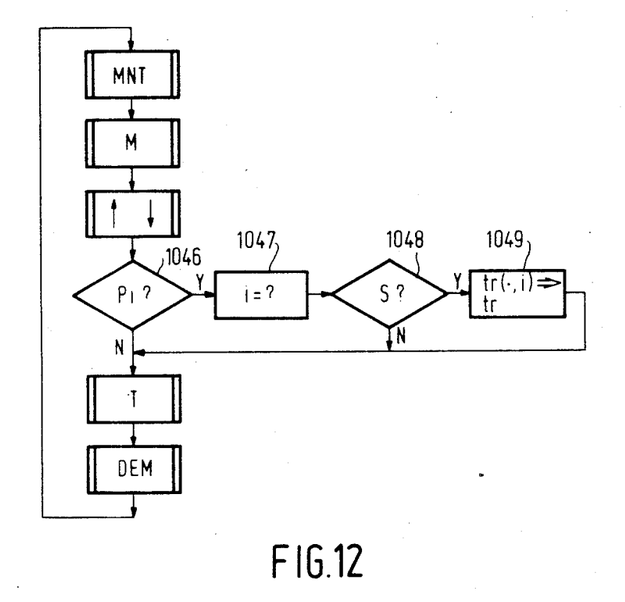

In order to make in a given preselection transmitter memory PSTR(.) the $i^{th}$ preselection tuning value tr(.,i) equal to the tuning value tr of a given preset station, the manual programming action shown in FIG. 12 may, for example, be effected. It is initiated by operating the manual tuning keys, which causes first the mute operation and then the manual tune operation shown in detail in FIG. 11 to be effected in succession. When the manual tuning keys are no longer operated it is thereafter checked in a step 1046 whether a preselection key Pi has been operated. If so, then in step 1047 it is determined which preselection key has been operated or what is the value of i. In step 1048 it is checked whether the storage key has been operated and thereafter in step 1049 the preselection tuning value tr(.,i) is made equal to the actual tuning value tr stored at that moment in the transmitter memory TRM. Thereafter, or when a preselection key or the storage key S have not been operated, the tune operation and the demute operation are again effected in succession, whereafter the micro-computer returns to the monitoring operation.

The receiver operates quite differently from the above-described manual programming action when the storage key S is operated in combination with the wave range key AW. In response to the operation of these two keys the micro-computer receives a preprogramming action-start-command causing the automatic pre-programming action shown schematically in FIG. 13 to be effected. Therein the mute operation is followed by an automatic scanning operation 1054. During that scanning operation the overall wave range is scanned because a fixed sequence of tuning values tr is applied to the transmitter memory TRM and consequently also to generator 4, the difference between two consecutive tuning values being equal to the step size S(AW). In response to each of these tuning values the conversion circuit 11 produces a receiving level CR. This receiving level and the associated tuning value tr are stored in the auxiliary memory HM.

Figure 13:
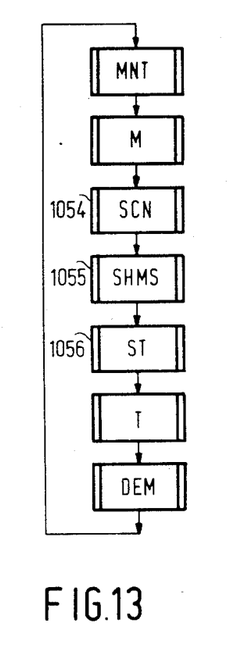

The scanning operation 1054 is followed by a selection operation 1055. Therein a sequence of reference levels RCR(MX), RCR(MX)—RCR(S.), RCR(MX)—2RCR(S.), RCR(MX)—3RCR(S.), . . . RCR(MN) is generated. All receiving levels stored in the auxiliary memory HM are compared sequentially with the then-present reference level RCR(AC). Each time it is found that a predetermined receiving level is at least equal to the said actual reference level the associated tuning value is stored in the memory field PSTR(AW). This actual reference level is first chosen equal to RCR(MX), so that all K(AW)=410 receiving levels are first compared with RCR(MX). If it appears that less than six receiving levels are at least equal to RCR(MX) the actual reference level is made equal to RCR(MX)—RCR(S.) and all the 410 receiving levels are compared with this new value of the actual reference level etc.

It will be obvious that all those receiving levels which are at least equal to RCR(MX)−qRCR(S.) also exceed RCR(MX)−(q+1)RCR(S.). In order to prevent the tuning values associated with these receiving levels from being stored for the second time in a memory location of the preselection transmitter memory PSTR(AW), each time such a tuning value is stored in the memory PSTR(AW) the relevant receiving level in the auxiliary memory HM is replaced by the level RCR(MN). When the actual reference level has ultimately assumed the value RCR(MN) and a new preselection tuning value has not yet been entered in all the six memory locations of the preselection transmitter memory PSTR(AW) the remaining memory locations are filled with the tuning value 0.

Finally, the selection operation 1055 is followed in succession, by a set operation 1056, the tune operation and the demute operation, whereafter the micro-computer returns to the monitor operation.

In the set operation the tuning value tr in the transmitter memory TRM is made equal to the tuning value tr(AW,1) as if the preselection key P1 were operated.

Figures 14, 15:
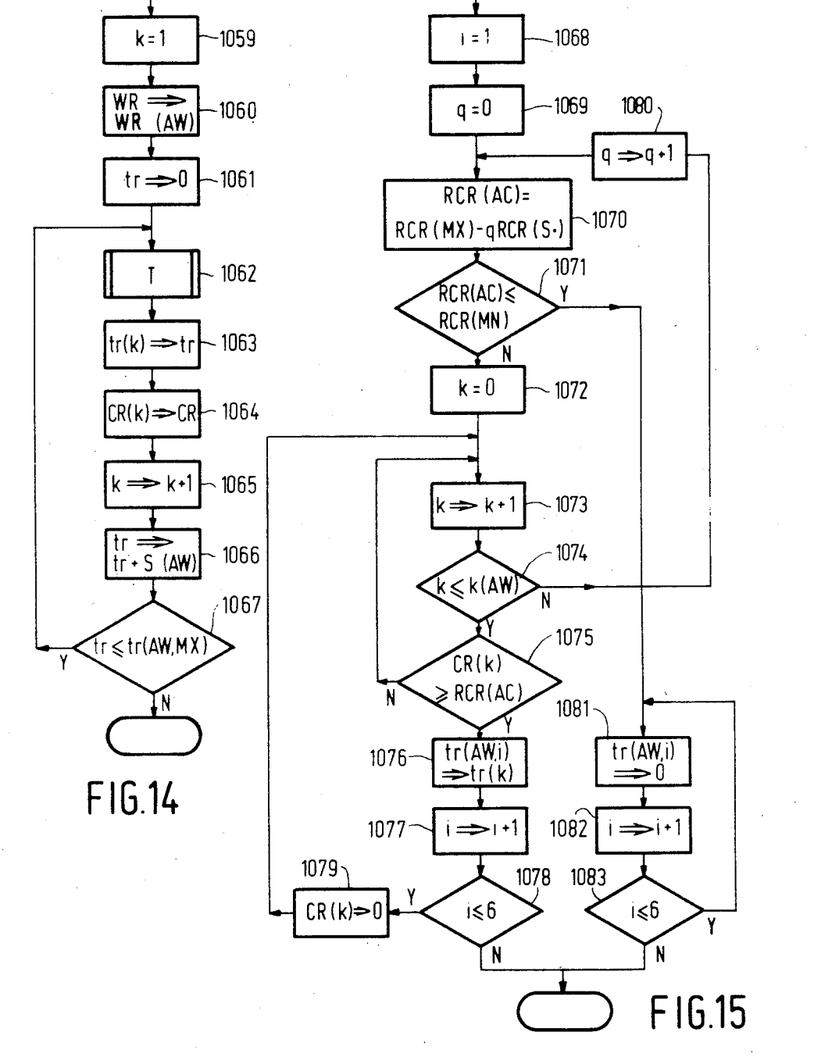

The above-described scanning operation is shown schematically in greater detail in FIG. 14. It comprises a step 1059 in which a k-counter which counts the number of memory locations k of the auxiliary memory field HM is adjusted to the value one. Thereafter, in step 1061 the wave range value WR in the transmitted memory TRM is made equal to WR(AW) and in step 1061 the tuning value tr is made equal to zero in the transmitter memory TRM. With the quantities thus present in the transmitter memory TRM the receiver is tuned by means of the tune operation 1062. As a result thereof the receiving level CR occurs at the output of the conversion circuit 11. In step 1063 the auxiliary tuning value tr(k) is now first made equal to the tuning value tr stored in the transmitter memory TRM and thereafter in step 1064 the auxiliary receiving level CR(k) associated with tr(k) is made equal to the actual receiving level occurring at the output of the conversion circuit 11. Thereafter, in step 1065 the k-counter is incremented by one and in step 1066 the tuning value stored in the transmitter memory TRM is incremented by the step size S(AW), which results in a new tuning value. Finally, in step 1067 this new tuning value is compared with the maximum tuning value tr(AW,MX). Each time the new tuning value is found to be less than this maximum tuning value, the steps 1062 to 1067, inclusive are effected for this new tuning value. If, however, the new tuning value is found to exceed the maximum tuning value then the scanning operation has ended.

The selection operation 1055 shown in FIG. 13 is shown in greater detail in FIG. 15. It comprises a step 1068 in which an i-counter is adjusted to the value one. This i-counter indicates the ordinal number of that memory location of the preselection transmitter memory PSTR(AW) in which a new preselection tune value can be stored. In a step 1069 a q-counter is adjusted to the value zero. This q-counter indicates by how many step sizes RCR(S.) the maximum reference level RCR(MX) must be reduced to obtain the actual reference level. In step 1070 the actual reference level RCR(AC) is made equal to the maximum reference level RCR(MX) reduced by q step sizes RCR(S.). Thereafter, in step 1071 it is checked whether the actual reference level has become lower than or equal to the minimum reference level RCR(MN). If not, then in step 1072 the above-mentioned k-counter is first reset to zero, thereafter its counting position is incremented by one in step 1073 and in step 1074 it is checked whether the new count position is less than or equal to the number of auxiliary tuning values k(AW) stored in the auxiliary memory field HM. If the new counting position k is less than or equal to k(AW) then it is checked in step 1075 whether the receiving level CR(k) is at least equal to the actual reference level RCR(AC). If not, then the k-counter is incremented by one in step 1073 and the steps 1074 and 1075 are repeated.

When in step 1075 it is found that CR(k) is indeed at least equal to RCR(AC), then the transmitter value tr(k) associated with this auxiliary receiving level is stored in the memory location i of the preselection transmitter memory PSTR(AW) indicated by the i-counter; in other words tr(AW,i) is made equal to tr(k). This occurs in step 1076. Thereafter, in step 1077 the i-counter is incremented by one. When it is found in step 1078 that the new counting position of this i-counter thus obtained is less than or equal to the number (6) of memory locations of the preselection transmitter memory PSTR(AW), then the auxiliary receiving level CR(k) is made equal to zero in step 1079 and a return is made to step 1073. If the new counting position of the i-counter exceeds the number (6) of memory locations of the preselection transmitter memory PSTR(AW) then the selection operation has ended.

When in step 1074 it is found that k has become higher than k(AW) and consequently all the auxiliary receiving levels have been compared in the auxiliary memory HM with the actual reference level, the quantity q is incremented by one in step 1080 and, acting thus a new actual reference level is determined in step 1070. When in step 1071 it is found that this new reference level is lower than the minimum reference level RCR(MN), then a zero is written by means of the steps 1081, 1082 and 1083 into all the remaining memory locations of the preselection transmitter memory PSTR(AW), whereafter the selection operation has ended as yet.

Figures 16, 17:
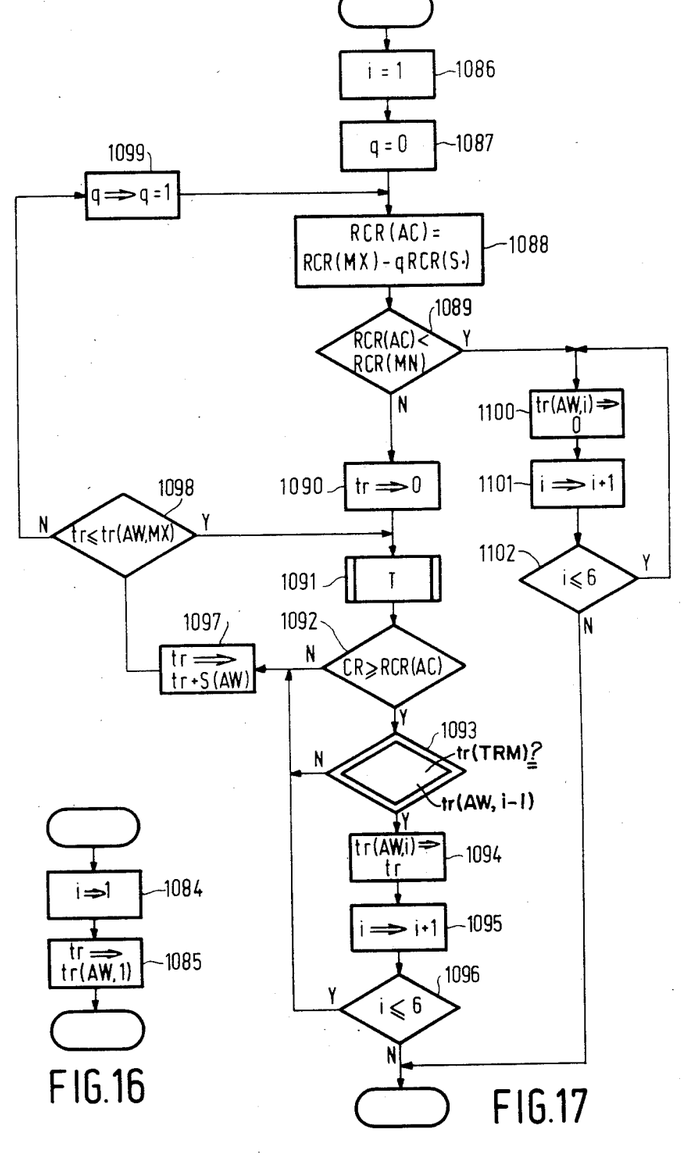

The set operation 1056 is shown in greater detail in FIG. 16. It comprises a step 1084 in which the i-counter is adjusted to the value one. Thereafter, in step 1085 the preselection tuning value tr(AW,1) is transferred to the transmitter memory TRM, whereafter this adjusting operation has ended.

In the preceding it has been assumed that the memory 105 has such a storage capacity that all the 410 auxiliary tuning data used for scanning the wave range UW and all the receiving levels obtained thereby can even be stored therein. In practice this will usually appear to be impossible. Therefore in practice preference will be given to an automatic preprogramming action in which the scanning operation 1054 and the selection operation 1055 shown in FIG. 13 are interwoven into a combined scanning-selection operation. A certain actual reference level will then be defined first, more particularly for the entire duration of a scanning operation. For each transmitter the receiver is tuned to during this scanning operation it is immediately checked whether the associated receiving level is at least equal to the defined actual reference level. If so, the relevant tuning value is directly stored in an as yet unoccupied memory location of the preselection transmitter memory PSTR(AW). If all memory locations of PSTR(AW) have been filled in this way, this combined scanning-selection operation is stopped. If, however, for all the 410 tuning values the associated receiving values have been compared with the defined actual reference value and it has been found that it is not possible to receive six transmitters whose receiving level is at least equal to the actual reference level, then the latter is decreased by the step size RCR(S.) and the combined scanning-selection operation is restarted. The above procedure is repeated until all the six memory locations of PSTR(AW) have been filled or until the actual reference level has become lower than RCR(MN).

It should be noted that when the combined scanning-selection operation is effected for the $q^{th}$ time and the reference level has decreased to a value RCR(MX)−q RCR(S.), all those transmitter values can of course be stored again which, during effecting of preceding combined scanning-selection operations were found to have already a receiving level which was at least equal to the actual reference level then holding. To prevent this, each tuning value which in principle is suitable for storage in the preselection transmitter memory PSTR(AW) is first compared to the tuning values preselection tuning values stored during those preceding combined scanning-selection operations. Any unstored tuning value is now stored.

The above-described combined scanning-selection operation is shown schematically in FIG. 17. It comprises the step 1087 in which the i-counter is again adjusted to the value one and the step 1087 in which the q-counter is again reset to the value zero. In step 1088 the actual reference level RCR(AC) is determined. This level is now also equal to RCR(MX) minus q times the reference step size RCR(S.). In step 1089 it is now again checked whether the new actual reference level is lower than the minimum reference level RCR(MN). If not, then in step 1090 the tuning value tr in the transmitter memory TRM is again made equal to zero. Thereafter the tune operation 1091 is effected as a result of which the receiving level CR is obtained at the output of the conversion circuit 11, which level is compared in step 1092 with the actual reference level RCR(AC). If CR is at least equal to RCR(AC), then in the comparing operation 1093 the tuning value tr in the transmitter memory TRM is compared with all the preselection tuning values tr(AW,i−1) already stored in the memory PSTR(AW). If this new tuning value is not equal to all the preselection tuning values already stored, then in step 1094 the preselection tuning value tr(AW,i) is made equal to the tuning value tr present in transmitter memory TRM. Thereafter, in step 1095 the counting position of the i-counter is incremented by one step. If step 1096 shows that the counting position of this i-counter now exceeds the number of memory locations (6) in the preselection transmitter memory PSTR(AW) then the combined scanning-selection operation has ended.

If the counting position of the i-counter does not exceed 6 or if the receiving level of the transmitter the receiver is tuned to is lower than the actual reference level or if the tuning value tr in the transmitter memory TRM is equal to one of the preselection tuning values tr(AW.) already stored in the preselection transmitter PSTR(AW) then in step 1097 the tuning value tr contained in the transmitter memory TRM is increased by the tuning step size S(AW). The new tuning value thus obtained is compared in step 1098 with the maximum tuning value tr(AW,MX). If the new tuning value is not more than equal to this maximum tuning value the receiver is tuned again by means of the tuning operation 1095. If, however, the new tuning value exceeds the maximum tuning value, this means that the overall wave range has been scanned and in step 1099 the content of the q-counter is again incremented by one, whereafter step 1088 is effected again.

If in step 1089 it is found that the new actual reference level RCR(AC) is lower than RCR(MN), a zero is written into the remaining memory locations of the preselection transmitter memory PSTR(AW) by means of the steps 1100, 1101 and 1102, whereafter this combined scanning-selection operation has also ended.

If in the manner shown in FIG. 13 all the memory locations of the preselection transmitter memory PSTR(AW) have been filled, it may happen that a tuning value stored therein corresponds to a station which is not wanted by the listener. Such a station can be replaced by operating again the preselection key Pi corresponding to this transmitter. For that purpose the preselection action shown in FIG. 11 is effected. If now more specifically the preselection key Pi is operated uninterruptedly for a period of time longer than a predetermined time $T_o$ then the replace operation 1042 is also effected, which is shown in greater detail in FIG. 18 and is in principle provided by a modified version of the combined scanning-selection operation shown in FIG. 17. This modification is such that only one preselection tuning value is changed. The replace operation shown in FIG. 18 comprises the same steps as the combined scanning-selection operation shown in FIG. 17 with the exception, however, of the steps 1086, 1095, 1096, 1101 and 1102. In all further respects this replace operation of the combined scanning-selection operation exists in that in the compare operation 1109 the tuning value tr present in the transmitter memory TRM is now compared with all the six preselection tuning values in the preselection memory PSTR(AW).

Figures 18, 19:
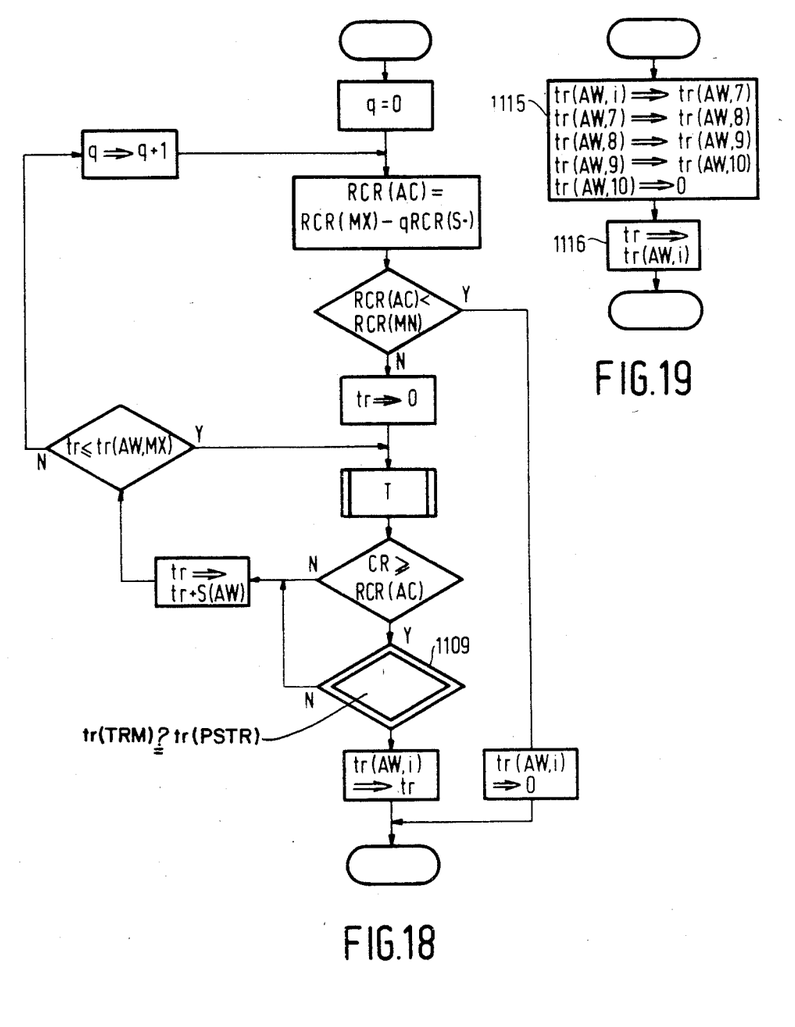

By effecting the replace operation the tuning value of the unwanted transmitter is now no longer present in the preselection transmitter memory PSTR(AW). If now a preselection key Pi were operated uninterruptedly for the second time during at least a period of time $T_o$, then the replace operation should again be effected and it is not inconceivable that the tuning value of the above-mentioned, unwanted station were yet stored in the pre-selection transmitter memory. To prevent this, it is advantageous to extend the preselection transmitter memory PSTR(AW) with a number of further memory locations, for example four locations, comprising the preselection tuning values tr(AW,7), tr(AW,8), tr(AW,9), tr(AW,10). When an unwanted tuning value is replaced by a new tuning value one of these further preselection tuning values may be replaced by the tuning value of the unwanted station, so that it does not get lost.

It should be noted that if the preselection transmitter memory PSTR(AW) is chosen such that it comprises, for example, ten memory locations, then by means of the automatic preprogramming action shown in FIG. 13 a preselection tuning value can be stored in each of these ten memory locations. As only the preselection tuning values tr(AW,1) to tr(AW,6), inclusive can be conveyed to the transmitter memory TRM by means of an associated preselection key Pi, the remaining four preselection tuning values tr(AW,7) to tr(AW,10), inclusive can be used to replace an unwanted tuning value of the group tr(AW,1) to tr(AW,6), inclusive. The replace operation shown in FIG. 12 is then preferably effected in the manner shown schematically in FIG. 19. It comprises a step 1115 in which the preselection tuning value tr(AW,i), which is associated with the operated preselection key Pi, is replaced by tr(AW,7). Thereafter, tr(AW,7) is replaced by tr(AW,8), then tr(AW,8) is replaced by tr(AW,9) which itself is replaced by tr(AW,10). The value zero can then be assigned to the last-mentioned preselection tuning value tr(AW,10). Finally, in step 1116 the tuning value tr in the transmitter memory TRM is made equal to the new preselection tuning value tr(AW,i).

What is claimed is:

1. In a broadcast receiver having an input for receiving aerial signals transmitted from broadcast stations, means for generating oscillator signals having frequencies depending on tuning values applied thereto, mixing circuit means connected to said input and said oscillator signal generating means for generating mixing circuit output signals in response to said aerial signals and said oscillator signals, each of said mixing circuit output signals having a receiving level value associated with a corresponding tuning value, apparatus for selecting N receivable broadcast stations within a given wavelength range, comprising preselection memory means user-connectable to said oscillator signal generator means, said preselection memory means having addressable memory locations for storing N preselection tuning values, each tuning in one of said N receivable broadcast stations;

means for furnishing a plurality of auxiliary tuning values within said given wavelength range and applying said auxiliary tuning values to said oscillator signal generating means, so that said mixing circuit means generates a plurality of mixing circuit output signals each associated with one of said auxiliary tuning values;

conversion circuit means connected to said mixing circuit means for converting each of said so-furnished mixing circuit output signals to a corresponding test level value thereby creating a plurality of test level values each associated with a corresponding tuning value;

means for furnishing a plurality of decreasing reference values starting with a maximum reference value; and means connected to said reference value furnishing means and said conversion circuit means for comparing said plurality of test level values first to said maximum reference value and subsequently to progressively lower ones of said reference values until N so-compared test level values exceed the reference value compared thereto, and storing the auxiliary tuning values associated with said N test level values in said addressable memory locations to constitute said preselection tuning values.

2. A broadcast receiver as set forth in claim 1, wherein said means for furnishing a plurality of decreasing reference values comprises means for decreasing said maximum reference value by a predetermined reference step size thereby furnishing a next highest reference value; and wherein said comparing means first compares said plurality of test level values to said maximum reference value, and compares said plurality of test level values to said next highest reference value only if less than N test level values exceed said maximum reference value.

3. A broadcast receiver as set forth in claim 2, wherein said plurality of decreasing reference values further comprises a minimum reference value; and wherein said comparing and storing means further comprises means for substituting said minimum reference value for the test level value associated with each of said tuning values stored by said comparing and storing means in said preselection memory means, thereby preventing a second storing of a tuning value previously stored in said preselection memory means.

* * * * *